United States Patent [19]

Ogawa et al.

[11] Patent Number: 6,090,688

[45] Date of Patent: *Jul. 18, 2000

[54] METHOD FOR FABRICATING AN SOI SUBSTRATE

[75] Inventors: Tadashi Ogawa; Akihiro Ishii; Yuichi Nakayoshi, all of Miyazaki, Japan

[73] Assignee: Komatsu Electronic Metals Co., Ltd., Kanagawa, Japan

[ * ] Notice: This patent is subject to a terminal disclaimer.

[21] Appl. No.: 08/749,798

[22] Filed: Nov. 15, 1996

[51] Int. Cl.[7] .......................... H01L 27/12; H01L 21/02; H01L 21/304

[52] U.S. Cl. .......................... 438/459; 438/690; 438/704; 438/734; 438/977; 216/20; 216/36; 216/53; 216/57

[58] Field of Search ...................... 438/690, 459, 438/704, 734, 977, 409; 216/36, 20, 53, 57, 79; 148/DIG. 12

[56] References Cited

U.S. PATENT DOCUMENTS

| | | | |
|---|---|---|---|
| 4,954,189 | 9/1990 | Hahn et al. | 148/33.2 |
| 5,051,134 | 9/1991 | Schnegg et al. | 134/3 |
| 5,238,875 | 8/1993 | Ogino | 437/225 |
| 5,340,435 | 8/1994 | Ito et al. | 156/632 |
| 5,478,408 | 12/1995 | Mitani et al. | 437/974 |
| 5,863,829 | 1/1999 | Nakayoshi et al. | 438/459 |

FOREIGN PATENT DOCUMENTS 8-274286  10/1996  Japan .

OTHER PUBLICATIONS

Nakayoshi et al. "Manufacture of laminated SOI substrate for semiconductor device" CA 126:68767, 1996.

*Primary Examiner*—Celia Chang
*Attorney, Agent, or Firm*—Welsh & Katz, Ltd.

[57] ABSTRACT

A method for fabricating an SOI substrate is provided, which has an active substrate formed as a thin film. The method comprises the steps of: using a both-side polishing apparatus to polish both sides of a supporting substrate 1; bonding an active substrate 2 onto the supporting substrate 1. to form a bonded-wafer; removing an unbonded portion formed at the circumference of the bonded-wafer; flat grinding the active substrate 2 to reduce the thickness thereof; etching the active substrate 2 by spin etching; and processing the active substrate to be a thin film by PACE processing.

2 Claims, 3 Drawing Sheets

METHOD FOR FABRICATING AN SOI SUBSTRATE

BACKGROUND OF THE INVENTION

1. Field of the invention

The present invention relates to a method for fabricating an SOI substrate, which is made by bonding an active substrate constituted by a second semiconductor wafer to a supporting substrate constituted by a first semiconductor wafer.

2. Description of prior art

Recently, the rapid development of integrated circuits has required improvement in the quality of fabricating SOI substrates. Particularly, in order to increase the operating speed of integrated circuits, the active substrate of an SOI substrate has to be made as thin as possible.

A prior-art method for fabricating an SOI substrate by bonding an active substrate constituted by a second semiconductor wafer to a supporting substrate constituted by a first semiconductor wafer comprises the steps of:

(1) forming an oxide film on the surface of the supporting substrate constituted by the first semiconductor wafer, bonding the active substrate constituted by the second semiconductor wafer onto the surface of the supporting substrate, and also forming an oxide film on the surface of the active substrate to form a bonded-wafer;

(2) removing the unbonded portion on the circumference of the bonded-wafer by grinding or etching;

(3) flat grinding to thin the active substrate; and (4) attaching a reverse side of the supporting substrate to an attaching block, and polishing to further thin the active substrate.

The thickness of the active substrate being thinned by such polishing is about 2–3 $\mu$m. However, in an SOI substrate used for fabricating high-speed integrated circuit, the thickness of an active substrate should be about 0.1 $\mu$m, which can be achieved by PACE processing. That is, PACE processing can be performed on the active substrate which has polished as above to form an uniform thin-film.

However, according to the method of performing PACE processing on the active substrate being attached and polished, the inner side of the supporting substrate has to be attached to the attaching block to perform polishing. Therefore, some tiny indentations and protrusions form on the active substrate if contaminations and indentations exist between the attaching block and the supporting substrate.

For example, referring to FIG. 2a, while a contamination 5 is formed on the attaching side of the attaching block 4, an indentation 5a caused by the contamination 5 is formed on the inner of the supporting substrate 1a as the attaching side is attached to the supporting substrate 1a. The indentation 5a can be formed on the upper side of the supporting substrate 1a with or without forming an oxide film 3a thereon, and the active substrate 2a is then attached to the supporting substrate 1a and is polished to form a rather thin portion 5b of the active substrate 2a as shown in FIG. 2b. When polishing is finished, the supporting substrate and active substrate are stripped off from the attaching block 4. After removing the wax 4a, the supporting substrate 1a is restored to its original shape, so that the rather thin portion 5b of the active substrate 2a forms a concave thereon as shown in FIG. 2c.

Referring to FIG. 3a, while the inner side of the supporting substrate 1b is provided with an indentation 6, by attaching the supporting substrate 1b to the attaching block 4, the portions of the oxide film 3b and the active substrate 2b corresponding to the indentation 6 are formed with indentations due to polishing pressure. Referring to FIG. 3b, the portion of the active substrate 2b becomes a rather thick portion 6a by polishing in such manner. While finished polishing, the supporting substrate and active substrate are stripped off from the attaching block 4, and the wax 4a is removed. The supporting substrate 1a is restored to its original shape, so that the rather thick portion 6a of the active substrate 2a forms a protrusion thereon as shown in FIG. 3c.

However, if there are some tiny indentations and protrusions formed on the surface of the supporting substrate, it can not be flatted even though PACE processing is performed. Therefore, an active substrate having an uniform thickness can not be obtained.

SUMMARY OF THE INVENTION

Accordingly, the object of the present invention is to provide a method for fabricating an SOI substrate having an active substrate which is formed as an uniform thin-film.

The method of fabricating an SOI substrate according to the present invention includes the steps of using a both-side polishing apparatus to polish the both sides of a supporting substrate semiconductor wafer at a time, bonding an active substrate constituted by a second semiconductor wafer to the upper side of the supporting substrate being both-side polished to form an bonded-wafer, removing the unbonded portion at the circumference of the bonded-wafer, flat grinding the active substrate of the bonded-wafer having the unbonded portion removed to reduce the thickness of the active substrate, employing spin etching to etch the surface of the active substrate being flat ground, and processing the active substrate being spin etched to be a thin film by PACE processing.

Moreover, the method for fabricating an SOI substrate can include the steps of using a both-side polishing apparatus to polish the both sides of a supporting substrate semiconductor wafer at a time, bonding an active substrate constituted by a second semiconductor wafer to the upper side of the supporting substrate being both-side polished to form an bonded-wafer, removing the unbonded portion at the circumference of the bonded-wafer, flat grinding the active substrate of the bonded-wafer having the unbonded portion removed to reduce the thickness of the active substrate, supporting the bonded-wafer being flat ground by a top ring, that is, single-wafer polishing the active substrate, and processing the active substrate being single-wafer polished to be a thin film by PACE processing.

BRIEF DESCRIPTION OF THE DRAWINGS

The following detailed description, given by way of example and not intended to limit the invention solely to the embodiments described herein, will best be understood in conjunction with the accompanying drawings in which.

DETAILED DESCRIPTION OF THE PREFERRED EMBODIMENTS

Figure 1A:
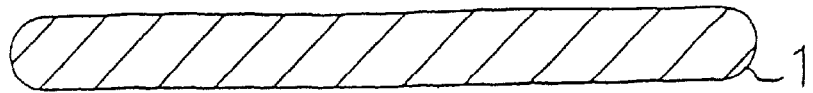
FIGS. 1a to 1e are diagrams illustrating the sectional side elevation of SOI substrate in each steps of the fabricating method according to the present invention.
Figure 1B:
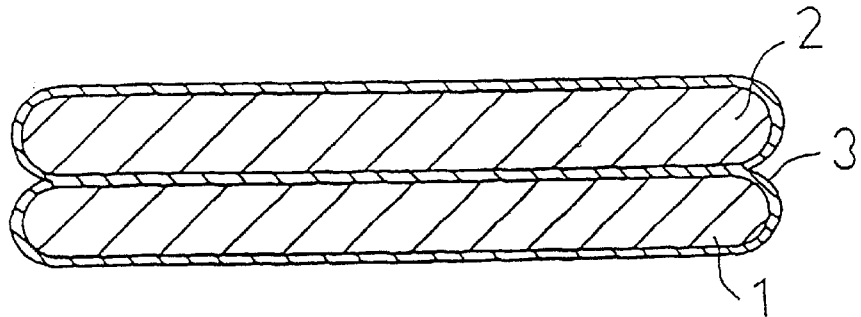
Figure 1C:
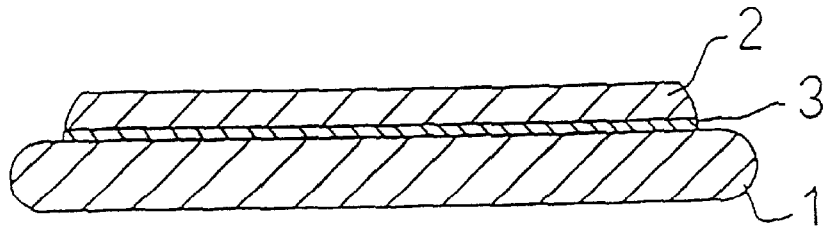
Figure 1D:
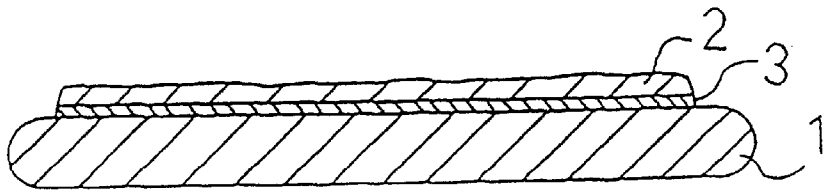
Figure 1E:
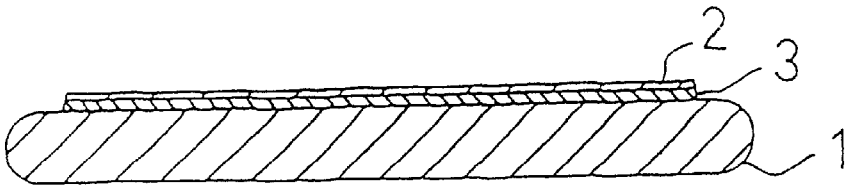
Figure 2A:
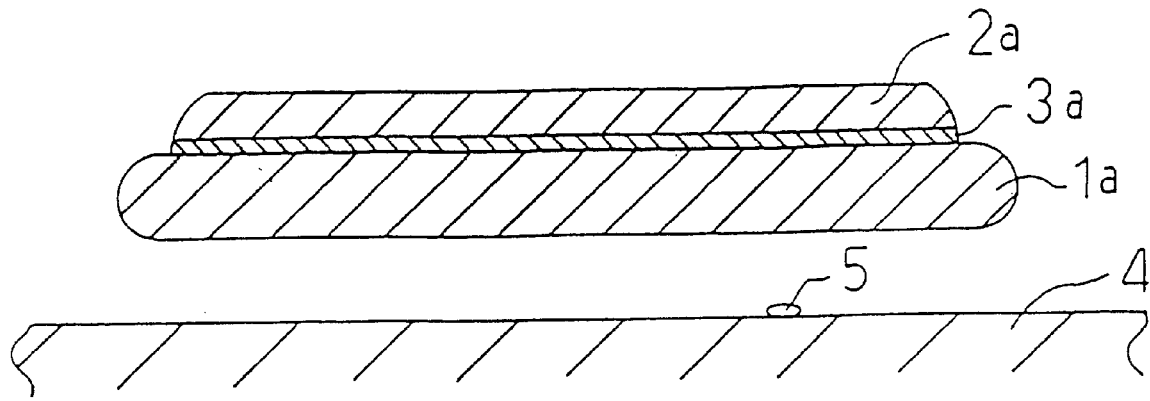
FIGS. 2a to 2c are diagrams illustrating the sectional side elevation of SOI substrate fabricated by a prior-art method.
Figure 2B:
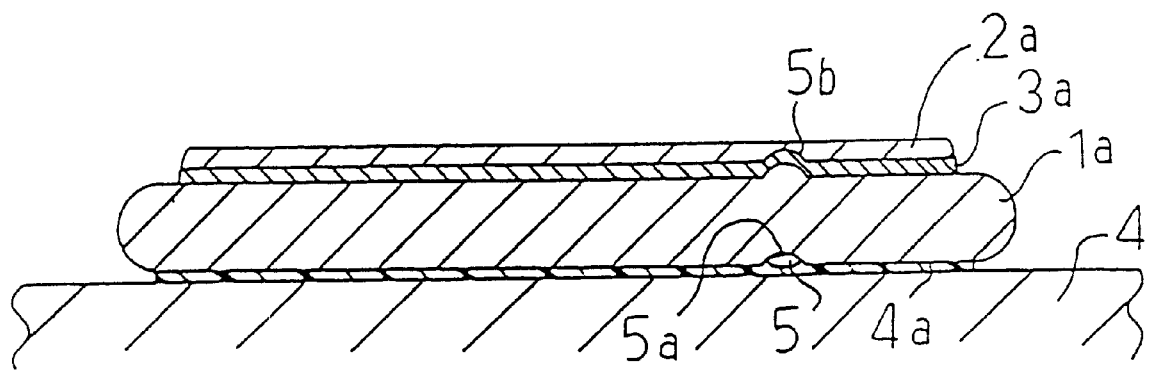
Figure 2C:
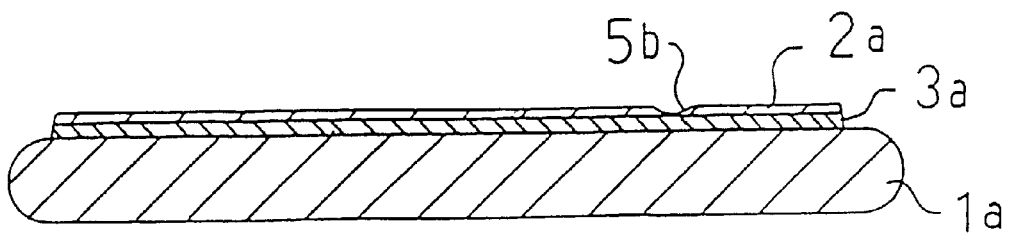
Figure 3A:
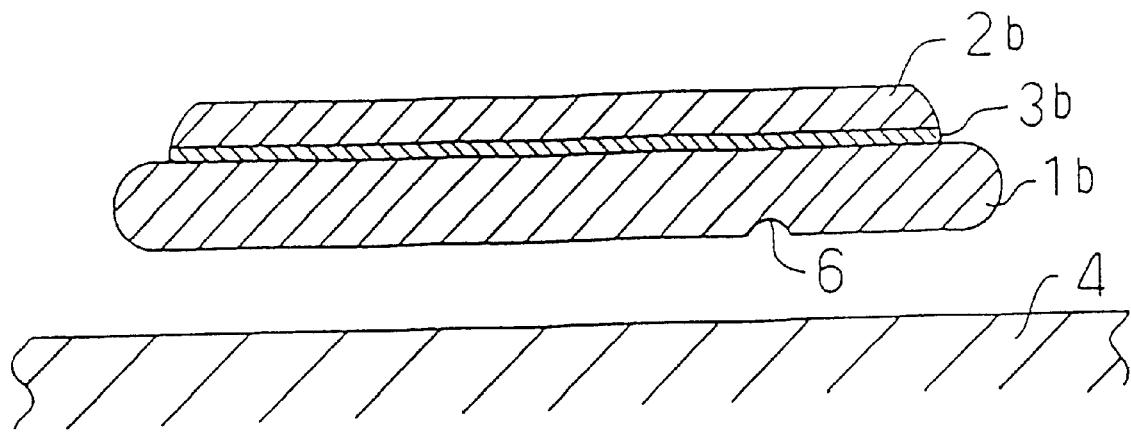
FIGS. 3a to 3c are diagrams illustrating the sectional side elevation of SOI substrate fabricated by another prior-art method.
Figure 3B:
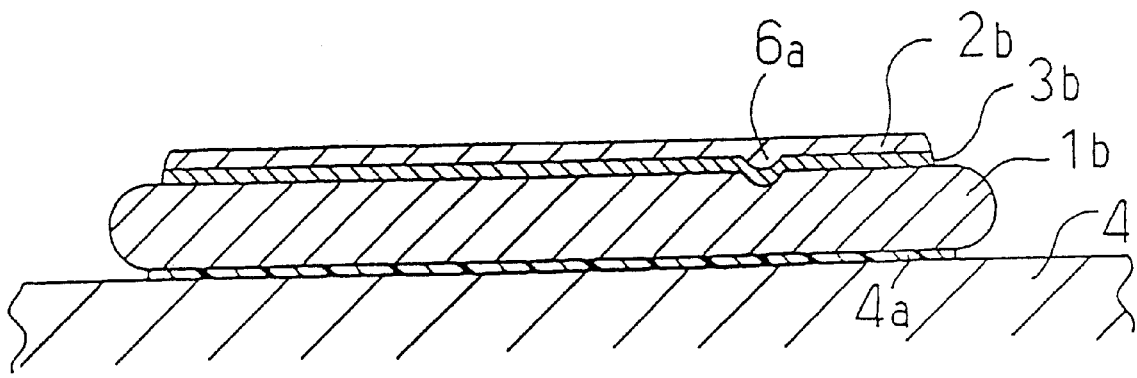
Figure 3C:
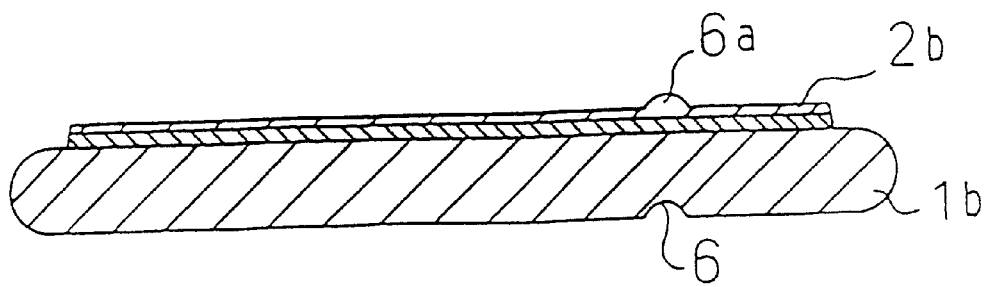

This embodiment of fabricating an SOI substrate is provided in accordance with the method including the following steps of:

(1) referring to FIG. 1a, using a both-side polishing apparatus to polish the both sides of a supporting substrate semiconductor wafer 1 to make the inner side and outer side of the semiconductor wafer flat, wherein the inner side of the supporting substrate 1 being both-side polished has no indentation formed thereon to effect the last engineering of forming the active substrate as a thin film;

(2) referring to FIG. 1b, forming an oxide film 3 on the surface of the supporting substrate 1 being both-side polished, and bonding the supporting substrate semiconductor wafer 2 thereon, then forming an oxide film 3 on the active substrate 2 to obtain an bonded-wafer;

(3) referring to FIG. 1c, removing the unbonded portion at the circumference of the bonded-wafer, and removing the oxide film except the oxide film 3 between the active substrate 2 and the supporting substrate 1, then flat grinding the upper side of the active substrate to reduce its thickness;

(4) referring to FIG. 1d, etching the surface of the active substrate 2 being flat ground by spin etching to further reduce the thickness of the active substrate 2, in which the spin etching can reduce the thickness about 10.0–20.0 μm, the resultant thickness variation is within ±5.0% of the reduced thickness, and is a thickness that can be removed by subsequent PACE processing, and compared with the polishing speed of the prior art of 0.8 μm/min, the etching speed of the spin etching is 30 μm/min, therefore the processing efficiency can be significantly raised;

(5) referring to FIG. 1e, PACE processing the surface of the active substrate being spin etched, since the thickness variation produced by spin etching is smooth and is different from the tiny indentations and protrusions formed by attached polishing of the prior art, the surface can be properly processed by using the dissociation ability of PACE processing, and the active substrate 1 forms an uniform thin-film which has a thickness variation within ±10.0 nm.

In the above embodiments, the active substrate being flat ground is processed as a thin film by spin etching, but not limited by the spin etching manner. Instead of spin etching, a single-wafer polishing manner can be used, in which the bonded-wafer being flat ground is supported by a top ring. Since a semiconductor wafer being both-side polished is used as a supporting substrate in this method, no deleterious effects occur on the active substrate because there have a good fit.

Moreover, comparing with the attached polishing of the prior art, the spin etching demonstrates a better production efficiency since it has a high speed.

What is claimed is:

1. A method for fabricating an SOI substrate, comprising the steps of:

(1) using a both-side polishing apparatus to polish both sides of a supporting substrate constituted by a first semiconductor wafer;

(2) bonding an active substrate constituted by a second semiconductor wafer onto the supporting substrate being both-side polished to form an bonded-wafer;

(3) removing an unbonded portion formed at the circumference of the bonded-wafer;

(4) flat grinding the active substrate of the bonded-wafer which has the unbonded portion removed to reduce the thickness thereof;

(5) etching the active substrate which has been flat ground by spin etching; and (6) processing the active substrate which has been etched by spin etching to be a thin film by PACE processing.

2. A method for fabricating an SOI substrate, comprising the steps of:

(1) using a both-side polishing apparatus to polish both sides of a supporting substrate constituted by a first semiconductor wafer;

(2) bonding an active substrate constituted by a second semiconductor wafer onto the supporting substrate being both-side polished to form an bonded-wafer;

(3) removing an unbonded portion formed at the circumference of the bonded-wafer;

(4) flat grinding the active substrate of the bonded-wafer which has the unbonded portion removed to reduce the thickness thereof;

(5) supporting the bonded-wafer which has been flat ground by a top ring, and then polishing the active substrate by single-wafer polishing; and (6) processing the active substrate which has been polished by single-wafer polishing to be a thin film by PACE processing.

* * * * *

UNITED STATES PATENT AND TRADEMARK OFFICE
CERTIFICATE OF CORRECTION

PATENT NO. : 6,092,688
DATED : July 25, 2000
INVENTOR(S) : Eberle et al.

It is certified that error appears in the above-identified patent and that said Letters Patent is hereby corrected as shown below:

Column 1, line 33, please delete "U.S. Pat. No. "8,988,417." and insert therefore --5,988,417.-- therefor.

Signed and Sealed this

Twenty-second Day of May, 2001

*Attest:*

NICHOLAS P. GODICI

*Attesting Officer*     *Acting Director of the United States Patent and Trademark Office*